US011232763B2

(12) United States Patent
Yuan et al.

(10) Patent No.: US 11,232,763 B2
(45) Date of Patent: Jan. 25, 2022

(54) SHIFT REGISTER AND DRIVING METHOD FOR COMPENSATING FOR LINEAR PATTERN APPEARING ON DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Zhidong Yuan, Beijing (CN); Yongqian Li, Beijing (CN); Haixia Xu, Beijing (CN); Can Yuan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/649,519

(22) PCT Filed: Mar. 25, 2019

(86) PCT No.: PCT/CN2019/079477
§ 371 (c)(1),
(2) Date: Mar. 20, 2020

(87) PCT Pub. No.: WO2020/191571
PCT Pub. Date: Oct. 1, 2020

(65) Prior Publication Data
US 2021/0217376 A1 Jul. 15, 2021

(51) Int. Cl.
*G09G 3/36* (2006.01)
(52) U.S. Cl.
CPC ......... *G09G 3/3696* (2013.01); *G09G 3/3677* (2013.01); *G09G 2310/0286* (2013.01);
(Continued)

(58) Field of Classification Search
CPC ...... G09G 3/36; G09G 3/3611; G09G 3/3614; G09G 3/3622; G09G 3/3625; G09G 3/364;
(Continued)

(56) References Cited

U.S. PATENT DOCUMENTS 10,777,142 B2 * 9/2020 Yuan .................... G09G 3/20
11,087,668 B1 * 8/2021 Li ...................... G09G 3/3258
(Continued)

FOREIGN PATENT DOCUMENTS

CN  108682397 A  10/2018
CN  108682398 A  10/2018
(Continued)

OTHER PUBLICATIONS

China First Office Action, Application No. 201980000383.3, dated Sep. 8, 2021, 34 pps.: with English translation.

*Primary Examiner* — Alexander Eisen
*Assistant Examiner* — Nelson Lam
(74) *Attorney, Agent, or Firm* — Armstrong Teasdale LLP (57) ABSTRACT

The embodiments of the present disclosure provide a shift register and a driving method thereof, a gate driving circuit, and a display device. The shift register includes a compensation selection circuit, a storage circuit, a blanking input circuit, and a shift register circuit. The compensation selection circuit is configured to provide an input signal to a first node. The storage circuit is configured to store and maintain a voltage difference between a blanking control signal terminal and the first node. The blanking input circuit is configured to provide a blanking input signal to a second node. The shift register circuit is configured to provide a compensation driving signal during a blanking period, and provide a scan driving signal during a display period.

19 Claims, 5 Drawing Sheets

(52) U.S. Cl.
CPC .......... *G09G 2310/061* (2013.01); *G09G 2320/0233* (2013.01)

(58) Field of Classification Search
CPC .. G09G 3/3674; G09G 3/3677; G09G 3/3681; G09G 2310/0286; G09G 2310/061
USPC ...................................... 345/76–83, 87–104
See application file for complete search history.

(56) References Cited

U.S. PATENT DOCUMENTS

| | | | |
|---|---|---|---|
| 2010/0134401 A1* | 6/2010 | Shin ............... | G09G 3/3611 345/99 |
| 2017/0178584 A1* | 6/2017 | Ma ................. | G09G 3/3696 |
| 2017/0256221 A1* | 9/2017 | Li ................... | G11C 19/28 |
| 2017/0270879 A1* | 9/2017 | Han ................ | G09G 3/3648 |
| 2018/0286302 A1* | 10/2018 | Feng ............... | G11C 19/287 |
| 2020/0168162 A1* | 5/2020 | Feng ............... | G09G 3/3266 |
| 2020/0185048 A1* | 6/2020 | Yang ............... | G11C 19/28 |

FOREIGN PATENT DOCUMENTS

| | | |
|---|---|---|
| CN | 108711401 A | 10/2018 |
| CN | 108806597 A | 11/2018 |
| CN | 108806611 A | 11/2018 |
| CN | 109192171 A | 1/2019 |
| CN | 109920380 A | 6/2019 |

\* cited by examiner

SHIFT REGISTER AND DRIVING METHOD FOR COMPENSATING FOR LINEAR PATTERN APPEARING ON DISPLAY DEVICE

CROSS REFERENCE TO RELATED APPLICATIONS

This patent application is a National Stage Entry of PCT/CN2019/079477 filed on Mar. 25, 2019, the disclosure of which is incorporated by reference herein in its entirety as part of the present application.

BACKGROUND

The present disclosure relates to display technology, and in particular to a shift register and a driving method thereof, a gate driving circuit, and a display device.

Gate driver on array (GOA) technology can implement a function of scanning pixels row by row by providing a gate driving circuit on an array substrate. The gate driving circuit may include a plurality of cascaded shift registers. The shift register may output a scan signal via an output terminal to drive a row of pixels and also output a cascade signal to drive the shift register at next stage.

In the field of display, an organic light-emitting diode (OLED) display device has the characteristics of wide angle of view and fast response speed and thus is widely used. The OLED display device utilizes a current provided by a driving transistor to drive a light-emitting element to emit light. Therefore, in order to meet the requirement of luminance uniformity, it is necessary to improve consistency of electrical characteristics of the driving transistor. Currently there are an internal compensation method and an external compensation method to improve the consistency of the electrical characteristic of the driving transistor.

BRIEF DESCRIPTION

Embodiments of the present disclosure provide a shift register and a driving method thereof, a gate driving circuit, and a display device.

A first aspect of the present disclosure provides a shift register. The shift register includes a compensation selection circuit, a storage circuit, a blanking input circuit, and a shift register circuit. The compensation selection circuit is coupled to a compensation selection control signal terminal, an input terminal, and a first node, and is configured to provide an input signal from the input terminal to the first node according to a compensation selection control signal from the compensation selection control signal terminal. The storage circuit is coupled to a blanking control signal terminal and the first node, and is configured to store and maintain a voltage difference between the blanking control signal terminal and the first node. The blanking input circuit is coupled to the first node, a blanking input signal terminal, and a second node, and is configured to provide a blanking input signal from the blanking input signal terminal to the second node according to a voltage of the first node. The shift register circuit is coupled to the second node, a clock signal terminal, the input terminal, and an output terminal, and is configured to provide, during a blanking period, a compensation driving signal via the output terminal according to a voltage of the second node and a clock signal from the clock signal terminal, and provide, during a display period, a scan driving signal via the output terminal according to the input signal and the clock signal.

In an embodiment of the present disclosure, the compensation selection circuit may include a first transistor. A control electrode of the first transistor may be coupled to the compensation selection control signal terminal, a first electrode of the first transistor may be coupled to the input terminal, and a second electrode of the first transistor may be coupled to the first node.

In an embodiment of the present disclosure, the storage circuit may include a first capacitor. A first electrode of the first capacitor may be coupled to the blanking control signal terminal, and a second electrode of the first capacitor may be coupled to the first node.

In an embodiment of the present disclosure, the blanking input circuit may include a second transistor. A control electrode of the second transistor may be coupled to the first node, a first electrode of the second transistor may be coupled to the blanking input signal terminal, and a second electrode of the second transistor may be coupled to the second node.

In an embodiment of the present disclosure, the blanking input signal terminal may be coupled to the blanking control signal terminal.

In an embodiment of the present disclosure, the shift register circuit may include a display input circuit, an output circuit, a pull-down circuit, a pull-down control circuit, a display reset circuit, and a blanking reset circuit. The display input circuit may be coupled to the input terminal and the second node, and may be configured to provide the input signal to the second node. The output circuit may be coupled to the second node, the clock signal terminal, and the output terminal, and may be configured to output, during the display period, the scan driving signal according to the voltage of the second node and the clock signal, and output, during the blanking period, the compensation driving signal according to the voltage of the second node and the clock signal. The pull-down circuit may be coupled to the second node, a third node, a first voltage terminal, and the output terminal, and may be configured to control voltages of the second node and the output terminal according to a voltage of the third node. The pull-down control circuit may be coupled to the second node and the third node, and may be configured to control the voltage of the third node according to the voltage of the second node. The display reset circuit may be coupled to a display reset signal terminal, the second node, and the first voltage terminal, and may be configured to reset the second node according to a display reset signal from the display reset signal terminal. The blanking reset circuit may be coupled to the blanking reset signal terminal, the second node, and the first voltage terminal, and may be configured to reset the voltage of the second node according to a blanking reset signal from the blanking reset signal terminal.

In an embodiment of the present disclosure, the display input circuit may include a third transistor. A control electrode and a first electrode of the third transistor may be coupled to the input terminal, and a second electrode of the third transistor may be coupled to the second node.

In an embodiment of the present disclosure, the output circuit may include a fourth transistor and a second capacitor. A control electrode of the fourth transistor may be coupled to the second node, a first electrode of the fourth transistor may be coupled to the clock signal terminal, and a second electrode of the fourth transistor may be coupled to the output terminal. A first electrode of the second capacitor may be coupled to the second node, and a second electrode of the second capacitor may be coupled to the output terminal.

In an embodiment of the present disclosure, the pull-down circuit may include a fifth transistor and a sixth transistor. A control electrode of the fifth transistor may be coupled to the third node, a first electrode of the fifth transistor may be coupled to the second node, and a second electrode of the fifth transistor may be coupled to the first voltage terminal. A control electrode of the sixth transistor may be coupled to the third node, a first electrode of the sixth transistor may be coupled to the output terminal, and a second electrode of the sixth transistor may be coupled to the first voltage terminal.

In an embodiment of the present disclosure, the pull-down control circuit may include an inverter. A first electrode of the inverter may be coupled to the second node, and a second electrode of the inverter may be coupled to the third node.

In an embodiment of the present disclosure, the display reset circuit may include a seventh transistor. A control electrode of the seventh transistor may be coupled to the display reset signal terminal, a first electrode of the seventh transistor may be coupled to the second node, and a second electrode of the seventh transistor may be coupled to the first voltage terminal.

In an embodiment of the present disclosure, the blanking reset circuit may include an eighth transistor. A control electrode of the eighth transistor may be coupled to the blanking reset signal terminal, a first electrode of the eighth transistor may be coupled to the second node, and a second electrode of the eighth transistor may be coupled to the first voltage terminal.

A second aspect of the present disclosure provides a gate driving circuit. The gate driving circuit includes a plurality of cascaded shift registers according to the first aspect of the present disclosure.

In an embodiment of the present disclosure, an output terminal of the shift register at an N-th stage may be coupled to an input terminal of the shift register at a (N+1)-th stage, where N is a positive integer.

In an embodiment of the present disclosure, the gate driving circuit may further include a compensation selection control signal line, a blanking control signal line, a blanking input signal line, and a first clock signal line. The compensation selection control signal line may be coupled to a compensation selection control signal terminal of each of the plurality of cascaded shift registers to provide a compensation selection control signal. The blanking control signal line may be coupled to a blanking control signal terminal of each of the plurality of cascaded shift registers to provide a blanking control signal. The blanking input signal line may be coupled to a blanking input signal terminal of each of the plurality of cascaded shift registers to provide a blanking input signal. The first clock signal line may be coupled to a clock signal terminal of the shift register at a (2N−1)-th stage to provide a clock signal. The second clock signal line may be coupled to a clock signal terminal of the shift register at a 2N-th stage to provide the clock signal, where N is a positive integer.

In an embodiment of the present disclosure, the gate driving circuit may further include a compensation selection control signal line, a blanking control signal line, a first clock signal line, and a second clock signal line. The compensation selection control signal line may be coupled to a compensation selection control signal terminal of each of the plurality of cascaded shift registers to provide a compensation selection control signal. The blanking control signal line may be coupled to a blanking control signal terminal of each of the plurality of cascaded shift registers to provide a blanking control signal, and may be coupled to a blanking input signal terminal of each of the plurality of cascaded shift registers to provide a blanking input signal. The first clock signal line may be coupled to a first clock signal terminal of the shift register at a (2N−1)-th stage to provide a clock signal. The second clock signal line may be coupled to a clock signal terminal of the shift register at a 2N-th stage to provide the clock signal, where N is a positive integer.

In an embodiment of the present disclosure, the gate driving circuit may further include a blanking reset signal line. The blanking reset signal line may be coupled to a blanking reset signal terminal of each of the plurality of cascaded shift registers to provide a blanking reset signal. An output terminal of the shift register at an (N+1)-th stage may be coupled to a display reset signal terminal of the shift register at an N-th stage, where N is a positive integer.

A third aspect of the present disclosure provides an array substrate. The array substrate includes the gate driving circuit according to the second aspect of the present disclosure.

A fourth aspect of the present disclosure provides a display panel. The display panel includes the array substrate according to the third aspect of the present disclosure.

A fifth aspect of the present disclosure provides a method for driving the shift register according to the first aspect of the present disclosure. In the method, during a display period, an input signal is provided to a first node according to a compensation selection control signal, and a voltage difference between a blanking control signal terminal and the first node is stored and maintained. During a blanking period, a blanking input signal is provided to a second node according to a voltage of the first node and a compensation driving signal is outputted according to a voltage of the second node and the clock signal.

In an embodiment of the present disclosure, the method may include providing, during the display period, the input signal to the second node, and outputting a scan driving signal according to the voltage of the second node and the clock signal.

BRIEF DESCRIPTION OF THE DRAWINGS

In order to illustrate the technical solutions of the embodiments of the present disclosure more clearly, drawings of the embodiments will be briefly described below. It should be appreciated that the drawings described below relate only to some embodiments of the present disclosure, rather than limiting the present disclosure. In the drawings.

DETAILED DESCRIPTION

In order to make the technical solutions and advantages of the embodiments of the present disclosure more clear, the technical solutions in the embodiments of the present disclosure will be clearly and completely described below in detail, in conjunction with the drawings. Obviously, the described embodiments described are merely some but not all of embodiments of the present disclosure. Based on the described embodiments of the present disclosure, all other embodiments obtained by those skilled in the art without creative work also fall within the protecting scope of the present disclosure.

Unless otherwise defined, all terms (including technical and scientific terms) used herein should have the same meaning as commonly understood by those skilled in the art to which the present disclosure belongs. In the present disclosure, the terms "first", "second", etc. are merely intended to distinguish one component (or a portion of the component) from another component (or another portion of the component), and should not be appreciated as indicating any one of the order of formation, a number, and a relative importance. Likewise, the terms "a(an)", "one", "the", etc. are intended to mean the presence of at least one element rather than limiting the number. The terms "comprising", "including", "containing", etc. are intended that an element or article ahead of this term encompasses element(s) (or equivalent(s)) or article(s) (or equivalent(s)) listed behind this term, and does not exclude the other elements or articles. The terms "connecting", "coupling", etc. are not limited to physical or mechanical connection, and additionally can include electrical connection, and it may refer to direct connection or connection via one or more intermediate medias. The terms "up", "down", "left", "right", etc. are merely used to describe a relative relationship of position, and when an absolute position of the described object is changed, the relative relationship of position may also be changed accordingly.

As mentioned above, the consistency of the electrical characteristics of the driving transistor may be improved by means of the internal compensation method or the external compensation method. With respect to compensating the pixels in the OLED display panel, in addition to the internal compensation by providing a compensation circuit in the pixel, external compensation may be implemented by providing a sensing transistor. In the external compensation, the gate driving circuit needs to provide the scan driving signal during the display period of a frame to make the pixels display, and also needs to provide a compensation driving signal during the blanking period of a frame to sense the current flowing through the pixel, so as to implement the external compensation. In an embodiment of the present disclosure, the blanking period refers to a time period in which the display panel does not display, and "a frame", "each frame", or "a certain frame" may include a display period and a blanking period in sequence.

In the conventional external compensation method, the gate driving circuit outputs the compensation driving signal to the pixels row by row. For example, the compensation driving signal is outputted to a first row of pixels during the blanking period of the first frame, and the compensation driving signal is output to the second row of pixels during the blanking period of the second frame, and so on, thereby implementing the sequential compensation of the display panel row by row.

However, with the method of the sequential compensation row by row described above, a linear pattern that moves row by row appears on the display panel. To this end, the embodiments of the present disclosure provide a novel shift register to compensate a row of pixels randomly, thereby avoiding the linear pattern on the display panel.

The embodiments of the present disclosure provide the shift register and the driving method thereof, the gate driving circuit, and the display device. The exemplary embodiments of the present disclosure will be described below in detail in conjunction with the drawings.

Figure 1:
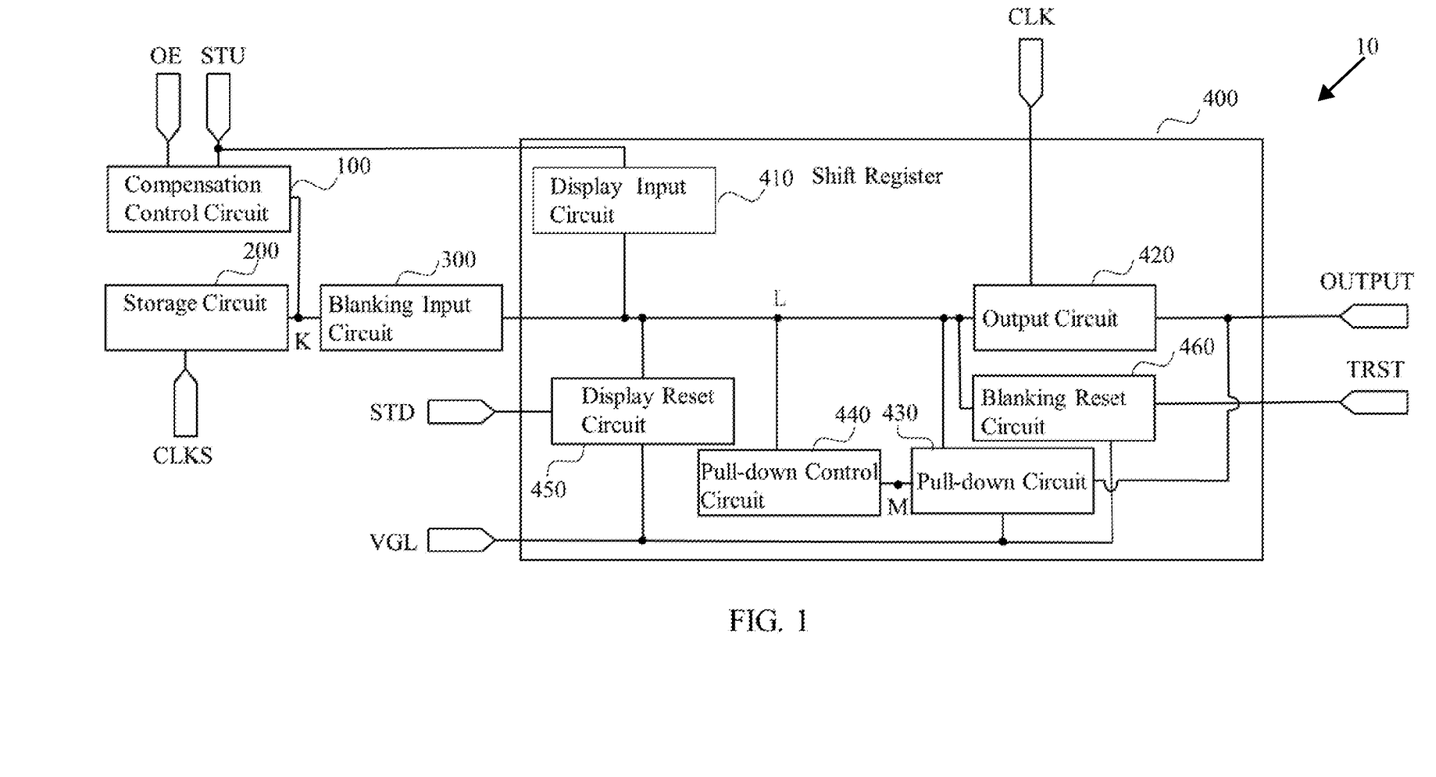
FIG. 1 shows a schematic block diagram of the shift register according to some embodiments of the present disclosure.

FIG. 1 shows a schematic block diagram of the shift register according to an embodiment of the present disclosure. As shown in FIG. 1, the shift register 10 may include a compensation selection circuit 100, a storage circuit 200, a blanking input circuit 300, and a shift register circuit 400. It will be described below in detail with reference to the drawing.

In the embodiments of the present disclosure, the compensation selection circuit 100 may be coupled to a compensation selection control signal terminal, an input terminal, and a first node K, and may provide an input signal STU from the input terminal to the first node K according to a compensation selection control signal OE from the compensation selection control signal terminal. In an embodiment, the compensation selection circuit 100 may be coupled to the compensation selection control signal terminal to receive the compensation selection control signal OE. The compensation selection circuit 100 may be coupled to the input terminal to receive the input signal STU. The compensation selection circuit may provide the received input signal STU to the first node K according to the received compensation selection control signal OE.

The storage circuit 200 may be coupled to a blanking control signal terminal and the first node K, and may store and maintain a voltage difference between the blanking control signal terminal and the first node K. In an embodiment, the storage circuit 200 may be coupled between the blanking control signal terminal and the first node K to store and maintain the voltage difference between the blanking control signal CLKS and the voltage of the first node K.

The blanking input circuit 300 may be coupled to the first node K, a blanking input signal terminal, and a second node L (also referred to as a pull-up node), and provide a blanking input signal BSTU from the blanking input signal terminal to the second node L according to the voltage of the first node K. In an embodiment, the blanking input circuit 300 may be coupled to the blanking input signal terminal to receive the blanking input signal BSTU. The blanking input circuit 300 may provide the received blanking input signal BSTU to the second node L according to the voltage of the first node K. In an embodiment, the blanking input signal terminal may be coupled to a voltage source to receive a voltage signal as the blanking input signal BSTU.

The shift register circuit 400 may be coupled to the second node L, a clock signal terminal, the input terminal, and an output terminal OUTPUT, and provide the compensation driving signal via the output terminal OUTPUT according to the voltage of the second node L and a clock signal CLK from the clock signal terminal during the blanking period. In an embodiment, the shift register circuit 400 may be coupled to the clock signal terminal to receive the clock signal CLK. During the blanking period, the shift register circuit 400 may output the received clock signal CLK via the output terminal OUTPUT according to the voltage of the second node L, as the compensation driving signal.

Furthermore, the shift register circuit 400 may provide the scan driving signal via the output terminal OUTPUT according to the input signal STU and the clock signal CLK during the display period. In an embodiment, the shift register circuit 400 may also be coupled to the input terminal to receive the input signal STU. During the display period, the shift register circuit 400 may output the clock signal CLK via the output terminal OUTPUT according to the received input signal STU, as the scan driving signal.

In an embodiment, during the display period of a frame, the scan driving signal of the shift register at a (N+1)-th stage may be used to control the shift of the shift registers at a (N+2)-th and at an N-th stages, for example, and to drive the corresponding row of pixels in the display panel to display. During the blanking period of a frame, the compensation driving signal from the shift register at the N-th stage may used to sense the driving current of the corresponding row of pixels, so as to make compensation according to the sensed driving current. In the embodiments of the present disclosure, N is a positive integer.

Further, in the embodiments of the present disclosure, the shift register circuit 400 may include a display input circuit 410, an output circuit 420, a pull-down circuit 430, a pull-down control circuit 440, a display reset circuit 450, and a blanking reset circuit 460. It will be described below in detail with reference to the drawings.

In an embodiment, the display input circuit 410 may be coupled to the input terminal and the second node L, and provide the input signal STU to the second node L. In an embodiment, the display input circuit 420 is coupled to the input terminal to receive the input signal STU, and provides the received input signal STU to the second node L.

In an embodiment, the output circuit 420 may be coupled to the second node, the clock signal terminal, and the output terminal OUTPUT, output the scan driving signal according to the voltage of the second node L and the clock signal CLK during the display period, and output the compensation driving signal according to the voltage of the second node L and the clock signal CLK during the blanking period. In an embodiment, the output circuit 420 may be coupled to the clock signal terminal to receive the clock signal CLK. During the display period, the output circuit 420 may output the received clock signal CLK via the output terminal OUTPUT according to the voltage of the second node L, as the scan driving signal. During the blanking period, the output circuit 420 may output the received clock signal CLK via the output terminal OUTPUT according to the voltage of the second node L, as the compensation driving signal.

Those skilled in the art will appreciate that the number of the output terminals is not limited to one and may be more than one. Correspondingly, each of the output circuits is coupled to the respective clock signal terminal, and output the respective driving signal according to the voltage of the second node L and the respective clock signal.

In an embodiment, the pull-down circuit 430 may be coupled to the second node L, the third node M (also referred to as a pull-down node), a first voltage terminal, and the output terminal OUTPUT, and may control the voltages of the second node L and the output terminal OUTPUT according to the voltage of the third node M. The pull-down circuit may be coupled to the first voltage terminal to receive a first voltage VGL. In an embodiment, the first voltage terminal may provide a low-level signal, that is, the first voltage VGL is at low level. The pull-down circuit 430 may also be coupled to the output terminal OUTPUT to control the voltages of the second node L and the output terminal OUTPUT according to the received first voltage VGL, under the control of the voltage of the third node M.

In an embodiment, the pull-down control circuit 440 may be coupled to the second node L and the third node, and control the voltage of the third node M according to the voltage of the second node L.

In an embodiment, the display reset circuit 450 may be coupled to a display reset signal terminal, the second node L, and the first voltage terminal, and reset the voltage of the second node L according to a display reset signal STD from the display reset signal terminal. In an embodiment, the display reset circuit 450 may be coupled to the display reset signal terminal to receive the display reset signal STD. The display reset circuit 450 may be coupled to the first voltage terminal to receive the first voltage VGL. The display reset circuit 450 may provide the received first voltage VGL to the second node L under the control of the received display reset signal STD, so as to pull down the voltage of the second node L to reset the second node L.

In an embodiment, the blanking reset circuit 460 may be coupled to the blanking reset signal terminal, the second node L, and the first voltage terminal, and may reset the voltage of the second node L based on a blanking reset signal TRST from the blanking reset signal terminal. In an embodiment, the blanking reset circuit 460 may be coupled to the blanking reset signal terminal to receive the blanking reset signal TRST. Also the blanking reset circuit 460 may be coupled to the first voltage terminal to receive the first voltage VGL. The blanking reset circuit 460 may provide the received first voltage VGL to the second node L under a control of the received blanking reset signal TRST, so as to pull down the voltage of the second node L to reset the second node L.

Although it is shown in FIG. 1 that the shift register 10 includes the pull-down circuit 430, the pull-down control circuit 440, the display reset circuit 450, and the blanking reset circuit 460, those skilled in the art will appreciate that it is not limited thereto. In practice, one or more of the above circuits may be used as needed, and various combinations and modifications of the above circuits will fall in the scope of the principles of the present disclosure.

Figure 2:
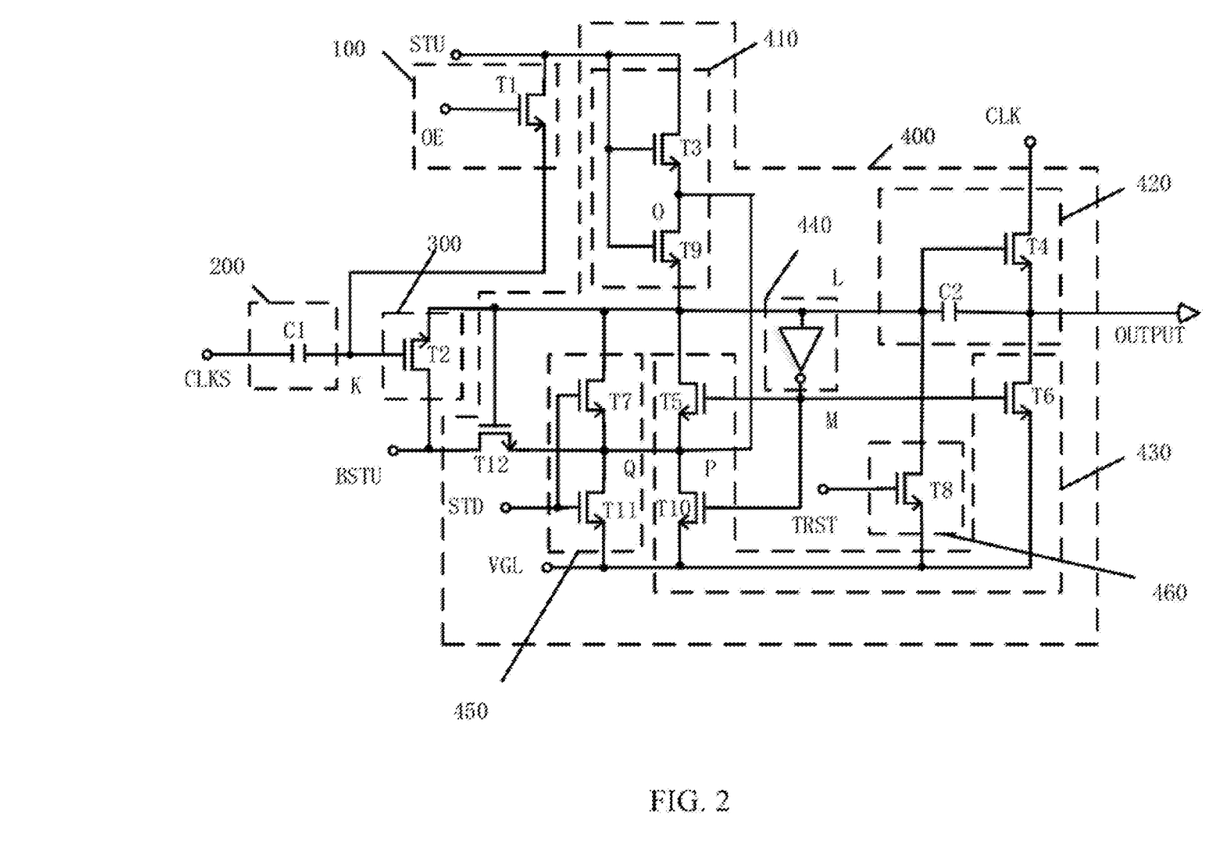
FIG. 2 shows an exemplary circuit diagram of the shift register according to some embodiments of the present disclosure.

The shift register of the embodiment of the present disclosure will be described below with an exemplary circuit structure. FIG. 2 shows an exemplary circuit diagram of the shift register according to an embodiment of the present disclosure. For example, the shift register is the shift register 10 as shown in FIG. 1. As shown in FIG. 2, the shift register may include first to eighth transistors T1 to T8, a first capacitor C1 and a second capacitor C2, and an inverter D.

It should be noted that transistors in the embodiments of the present disclosure may be a thin film transistor or a field effect transistor or other switching device with the same characteristics. Herein the thin film transistor is taken as an example for description. Due to source and drain electrodes of the transistor may be symmetrical in structure, there will be no difference between the source and drain electrodes. In the embodiments of the present disclosure, in order to distinguish two electrodes of the transistor other than the gate electrode, one of the two electrodes is referred to as a first electrode and the other one is referred to as a second electrode. The gate electrode of transistor may be referred to as a control electrode. Moreover, a transistor may be classified into a N-type or P-type transistor according to its characteristics. If the transistor is P-type, its ON voltage is a low level and OFF voltage is a high level. If the transistor is N-type, its On voltage is a high level and OFF voltage is a low level.

In addition, it should be noted that the transistors in the shift register according to the embodiments of the present disclosure are the N-type transistors by way of example. But the embodiments of the present disclosure are not limited to this, and for example, at least part of the transistors in the shift register may be P-type.

As shown in FIG. 2, the compensation selection circuit 100 includes the first transistor T1. The control electrode of the first transistor T1 is coupled to the compensation selection control signal terminal to receive the compensation selection control signal OE. The first electrode of the first transistor T1 is coupled to the input terminal to receive the input signal STU. The second electrode of the first transistor T1 is coupled to the first node K. In an embodiment, when the compensation selection control signal OE is at high level, the first transistor T1 is turned on, and the received input signal STU is provided to the first node K.

The storage circuit 200 includes the first capacitor C1. The first electrode of the first capacitor C1 is coupled to the blanking control signal terminal to receive the blanking control signal CLKS. The second electrode of the first capacitor C1 is coupled to the first node K. The first capacitor C1 may store the voltage difference between the blanking control signal CLKS and the first node K. In an embodiment, when the voltage of the first node K is at high level and the blanking control signal CLKS is at high level, the voltage difference between the two electrodes of the first capacitor C1 is zero and the first capacitor C1 is not charged. When the blanking control signal CLKS is at low level, the first node K is in a floating state. Due to the equation transition of the first capacitor C1, the voltage of the first node K is at high level, and the voltage difference between the two electrodes of the first capacitor C1 is maintained at zero.

The blanking input circuit 300 includes the second transistor T2. The control electrode of the second transistor T2 is coupled to the first control node K. The first electrode of the second transistor T2 is coupled to the blanking input signal terminal to receive the blanking input signal BSTU. The second electrode of the second transistor T2 is coupled to the second node L. In an embodiment, when the voltage of the first node K is at high level, the second transistor T2 is turned on to provide the received blanking input signal BSTU to the second node L.

The display input circuit 410 includes the third transistor T3. The control electrode and the first electrode of the third transistor T3 are coupled to the input terminal to receive the input signal STU. The second electrode of the third transistor T3 is coupled to the second node L. In an embodiment, when the input signal STU is at high level, the third transistor T3 is turned on to provide the received high-level input signal STU to the second node L.

The output circuit 420 includes the fourth transistor T4 and the second capacitor C2. The control electrode of the fourth transistor T4 is coupled to the second node L. The first electrode of the fourth transistor T4 is coupled to the clock signal terminal to receive the clock signal CLK. The second electrode of the fourth transistor T4 is coupled to the output terminal OUTPUT. The first electrode of the second capacitor C2 is coupled to the second node L, and the second electrode of the second capacitor C2 is coupled to the output terminal OUTPUT. In an embodiment, when the second node L is at high level, the fourth transistor T4 is turned on. During the display period, the output circuit 420 provides the received clock signal CLK to the output terminal OUTPUT as the scan driving signal. During the blanking period, the output circuit 420 provides the received clock signal CLK to the output terminal OUTPUT as the compensation driving signal.

The pull-down circuit 430 includes the fifth transistor T5 and a sixth transistor T6. The control electrode of the fifth transistor T5 is coupled to the third node M. The first electrode of the fifth transistor T5 is coupled to the second node L. The second electrode of the fifth transistor T5 is coupled to the first voltage terminal to receive the first voltage VGL. In an embodiment, when the third node M is at high level, the fifth transistor T5 and the sixth transistor T6 are turned on, and the first voltage VGL is provided to the second node L and the output terminal OUTPUT to pull down the voltages of the second node L and the output terminal OUTPUT.

The pull-down control circuit 440 includes the inverter D. The first electrode of the inverter D is coupled to the second node L, and the second electrode of the inverter D is coupled to the third node M. In an embodiment, when the voltage of the second node L is at high level, the voltage of the third node M is at low level due to the inverter D. When the second node L is at low level, the voltage of the third node M is at high level due to the inverter D.

The display reset circuit 450 includes the seventh transistor T7. The control electrode of the seventh transistor T7 is coupled to the display reset signal terminal to receive the display reset signal STD. The first electrode of the seventh transistor T7 is coupled to the second node L. The second electrode of the seventh transistor T7 is coupled to the first voltage terminal to receive the first voltage VGL. In an embodiment, when the display reset signal STD is at high level, the seventh transistor T7 is turned on to provide the high-level first voltage VGL to the second node L to reset the second node L.

The blanking reset circuit 460 includes the eighth transistor T8. The control electrode of the eighth transistor T8 is coupled to the blanking reset signal terminal to receive the blanking reset signal TRST. The first electrode of the eighth transistor T8 is coupled to the second node L. The second electrode of the eighth transistor T8 is coupled to the first voltage terminal to receive the first voltage VGL. In an embodiment, when the blanking reset signal TRST is at high level, the eighth transistor T8 is turned on to provide the high-level first voltage VGL to the second node L to reset the second node L.

Alternatively, in some embodiments of the present disclosure, the blanking input signal terminal may be coupled to the blanking control signal terminal to receive the blanking control signal as the blanking input signal.

Additionally, in other embodiments of the present disclosure, the shift register circuit 400 may further include a ninth transistor T9, a tenth transistor T10, an eleventh transistor T11, and a twelfth transistor T12 to prevent leakage.

The ninth transistor T9 may be provided in the display input circuit 410. The control electrode of the ninth transistor T9 is coupled to the control electrode of the third transistor T3. The first electrode of the ninth transistor T9 is coupled to the second electrode of the third transistor T3 via a fourth node O. The second electrode of the ninth transistor T9 is coupled to the second node L.

The tenth transistor T10 may be provided in the pull-down circuit 430. The control electrode of the tenth transistor T10 is coupled to the control electrode of the fifth transistor T5. The first electrode of the tenth transistor T10 is coupled to the second electrode of the fifth transistor T5 via a fifth node P. The second electrode of the tenth transistor T10 is coupled to the first voltage terminal VGL.

The eleventh transistor T11 may be provided in the display reset circuit 450. The control electrode of the eleventh transistor T11 is coupled to the control electrode of the seventh transistor T7. The first electrode of the eleventh transistor T11 is coupled to the second electrode of the seventh transistor T7 via a sixth node Q. The second electrode of the eleventh transistor T11 is coupled to the first voltage terminal.

The control electrode of the twelfth transistor T12 is coupled to the second node L. The first electrode of the twelfth transistor T12 is coupled to the blanking input signal terminal to receive the blanking input signal BSTU. The second electrode of the twelfth transistor T12 is coupled to the sixth node Q, the fifth node P, and the fourth node O sequentially In an embodiment, when the voltage of the second node L is at high level, the twelfth transistor T12 is turned on to provide the blanking input signal BSTU to the sixth node Q, the fifth node P, and the fourth node O. When the blanking input signal BSTU is at high level, the voltages of the sixth node Q, the fifth node P, and the fourth node O are all at high level. Therefore, for each of the fifth transistor T5, the seventh transistor T7, and the ninth transistor T9, the voltage difference between the first and second electrodes is close to zero. In this way, the leakage currents of the fifth transistor T5, the seventh transistor T7, and the ninth transistor T9 can be reduced, thereby reducing the leakage of the electrical charges of the second node L via the fifth transistor T5, the seventh transistor T7, and the ninth transistor T9.

It will be appreciated that each circuit of the shift register in the embodiments of the present disclosure is not limited to the circuit structures as above, and any other suitable circuit may also be used.

Figure 3:
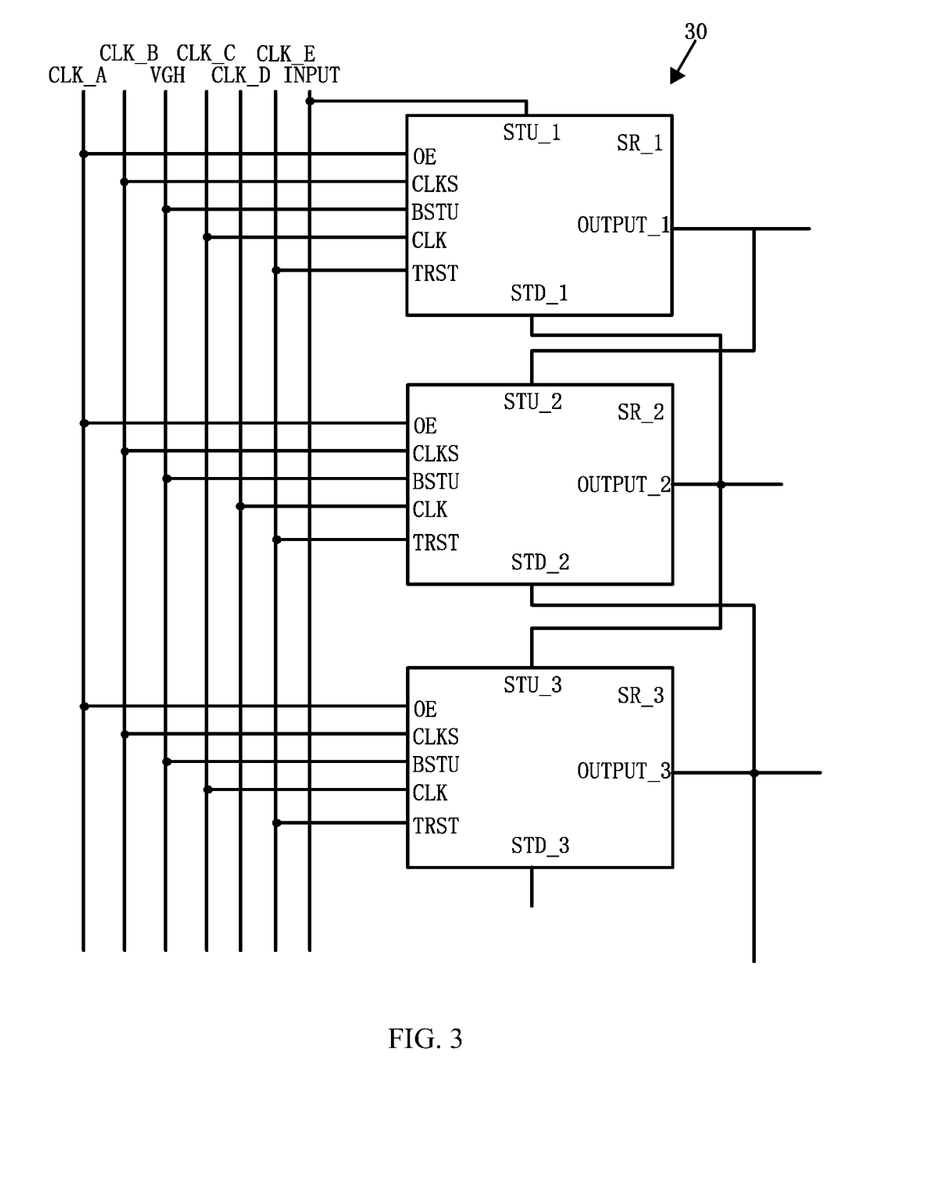
FIG. 3 shows a schematic diagram of the gate driving circuit according to some embodiments of the present disclosure.

The embodiments of the present disclosure also provide the gate driving circuit including the shift register as described above. FIG. 3 shows a schematic diagram of the gate driving circuit according to an embodiment of the present disclosure. As shown in FIG. 3, the gate driving circuit 30 may include a plurality of shift registers. Any one or more of the plurality of shift registers may employ the structure of the shift register 10 as described above or its variant. FIG. 3 schematically show the first three shift registers of the gate driving circuit 30 as example, i.e., a first shift register SR_1 corresponding to a first row of pixels, a second shift register SR_2 corresponding to a second row of pixels, and a third shift register SR_3 corresponding to a third row of pixels.

The output terminal of the shift register at an N-th stage may be coupled to the input terminal of the shift register at a (N+1)-th stage, where N is a positive integer. As shown in FIG. 3, the input terminal of the first shift register SR_1 receives the input signal STU_1 from an input signal line INPUT. The output terminal OUTPUT_1 of the first shift register SR_1 is coupled to the input terminal of the second shift register SR_2 to provide the input signal STU_2. The output terminal OUTPUT_2 of the second shift register SR_2 is coupled to the input terminal of the shift register SR_3 to provide the input signal STU_3.

In the embodiments of the present disclosure, the gate driving circuit 30 may further include a compensation selection control signal line CLK_A, a blanking control signal line CLK_B, a blanking input signal line VGH, a first clock signal line CLK_C, and a second clock signal line CLK_D. The compensation selection control signal line CLK_A is coupled to the compensation selection control signal terminals of the three shift registers to provide the compensation selection control signal OE. The blanking control signal line CLK_B is coupled to the blanking control signal terminals of the three shift registers to provide the blanking control signal CLKS. The blanking input signal line VGH is coupled to the blanking input signal terminals of the three shift registers to provide the blanking input signal BSTU. The first clock signal line CLK_C may be coupled to the clock signal terminal of the shift register at a (2N−1)-th stage to provide the clock signal CLK, and the second clock signal line CLK_D may be coupled to the clock signal terminal of the shift register at a 2N-th stage to provide the clock signal CLK, where N is a positive integer. In the embodiments of the present disclosure, the first clock signal line CLK_C is coupled to the clock signal terminal of the first shift register to provide the clock signal CLK, and the second clock signal line CLK_D is coupled to the clock signal terminals of the second shift register and the third shift register to provide the clock signal CLK.

Furthermore, the output terminal of the shift register at the (N+1)-th stage may be coupled to the display reset signal terminal of the shift register at the N-th stage, where N is a positive integer. As shown in FIG. 3, the output terminal OUTPUT_2 of the second shift register SR_2 is coupled to the display reset signal terminal of the first shift register SR_1 to provide the display reset signal STD_1. The output terminal OUTPUT_3 of the third shift register appliance SR_3 is coupled to the display reset signal terminal of the second shift register SR_2 to provide the display reset signal STD_2.

The gate driving circuit 30 may further include the blanking reset signal line CLK_E. The blanking reset signal line CLK_E may be coupled to the blanking reset signal terminals of the three shift registers to provide the blanking reset signal TRST.

Alternatively, in another embodiment of the present disclosure, the gate driving circuit may include the compensation selection control signal line CLK_A, the blanking control signal line CLK_B, the first clock signal line CLK_C, the second clock signal line CLK_D, and the blanking reset signal line CLK_E. The difference between this gate driving circuit and the gate driving circuit 30 shown in FIG. 3 is that the blanking control signal line CLK_B is not only coupled to the blanking control signal terminals of the three shift registers to provide the blanking control signal CLKS, but also coupled to the blanking input signal terminals of the three shift registers to provide the blanking input signal BSTU.

Figure 4:
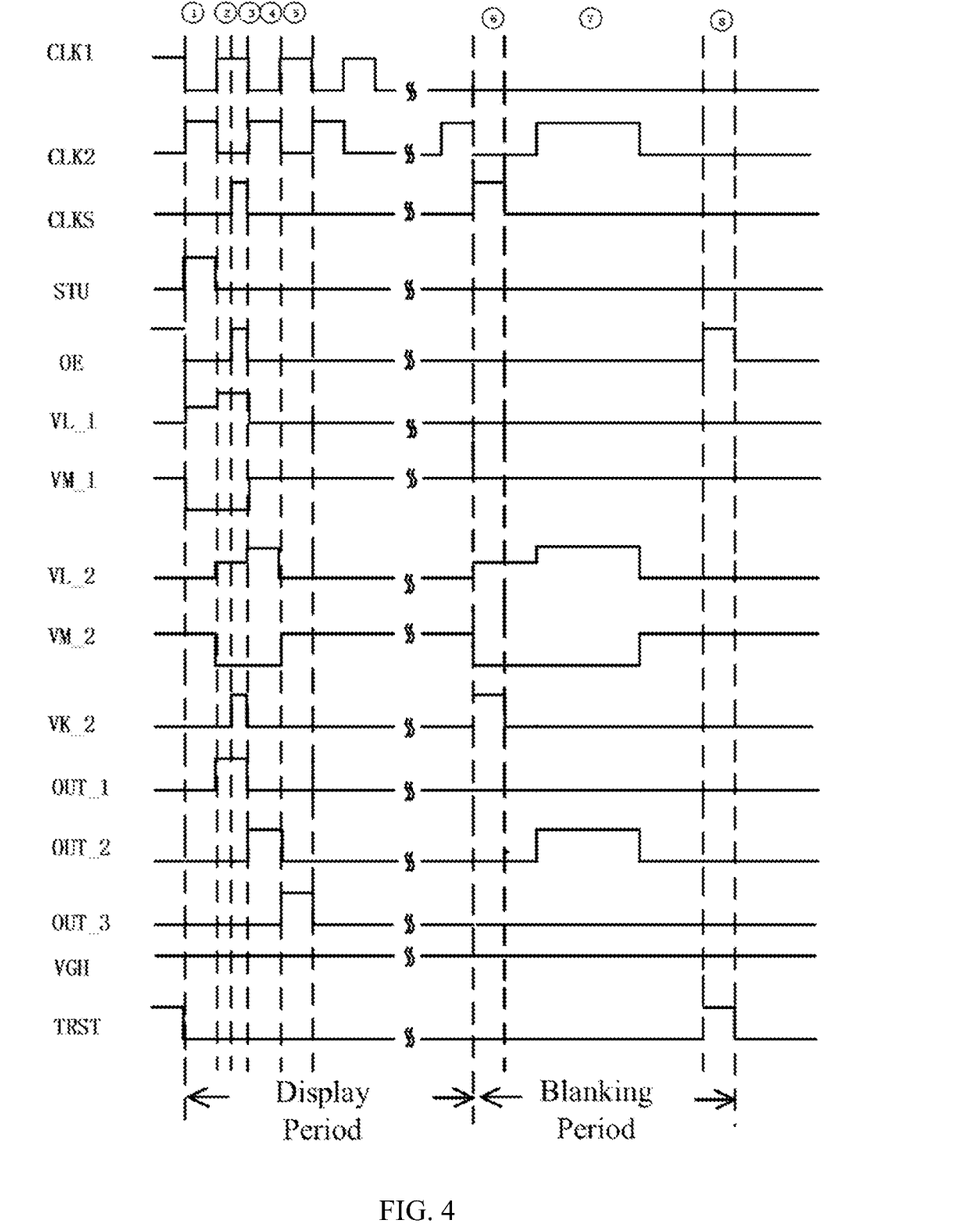
FIG. 4 shows a timing chart of signals in an operation of the gate driving circuit as shown in FIG. 3.

The operation of the gate driving circuit 30 shown in FIG. 3 will be described below with reference to a timing chart as shown in FIG. 4. In an embodiment, the gate driving circuit 30 includes the shift register as shown in FIG. 2.

FIG. 4 shows a timing chart of signals when the gate driving circuit 30 compensates the second row of pixels randomly. The first clock signal line CLK_C provides the clock signal CLK1 to the first shift register SR_1 and the third shift register SR_3. The second clock signal line CLK_D provides the clock signal CLK2 to the second shift register SR_2. The blanking control signal line CLK_B provides the blanking control signal CLKS to the three shift registers. The input signal line INPUT provides the input signal STU_1 to the first shift register SR_1 corresponding to the first row of pixels. The compensation selection control signal line CLK_A provides the compensation selection control signal OE to the three shift registers. Output signals OUT_1, OUT_2, and OUT_3 represent the signals outputted by the first shift register SR_1 corresponding to the first row of pixels, the second shift register SR_2 corresponding to the second row of pixels, and the third shift register SR_2 corresponding to the third row of pixels via the output terminals OUTPUT_1, OUTPUT_2, and OUTPUT_3, respectively. Signals VK, VL and VM represent voltage signals of the first node K_2, the second node L_2, and the third node M_2 of the second shift register SR_2 in the gate driving circuit 30, respectively. The blanking reset signal line CLK_E provides the blanking reset signal TRST to the three shift registers. It will be appreciated that the signal voltages in the timing chart as shown in FIG. 4 are only illustrative and do not represent the actual voltage values.

As shown in FIG. 4, a frame includes the display period and the blanking period. Before the beginning of the frame, both the blanking reset signal line CLK_E and the compensation selection control signal line CLK_A provide a high-level signal. Therefore, the first transistor T1 and the eighth transistor T8 in each of the three shift registers are all turned on. As a result, the input signal STU (at low level) is provided to the first node K to pull down the voltage of the first node K, and the first voltage VGL (at low level) is provided to the second node L to pull down the voltage of the second node L. Furthermore, due to the inverter D, the low-level voltage of the second node L results in the voltage of the third node M to be high-level. The fifth transistor T5, the sixth transistor T6, and the tenth transistor T10 are turned on to provide the first voltage VGL (at low level) to the second node L and the output terminal OUTPUT. As a result, the first node K, the second node L and the output terminal OUTPUT of the three shift registers are reset to achieve global reset.

Then, at the beginning of the frame, the signals provided by the blanking reset signal line CLK_E and the compensation selection control signal line CLK_A become low-level. The first transistor T1 and the eighth transistor T8 are turned off.

Next the operation of the first shift register SR_1 in the gate driving circuit 30 will be described in detail.

In the display period of the frame, the operation of the shift register SR_1 is described as follows.

In a first time period, the shift register SR_1 receives the high-level input signal STU_1, and the third transistor T3 and the ninth transistor T9 are turned on. The received high-level input signal STU_1 is provided to the second node L_1, and the voltage of the second node L_1 becomes high-level. The high-level voltage is maintained by the second capacitor C2. When the voltage of the second node L_1 is at high level, the twelfth transistor T12 is turned on, and the voltages of the fourth node O_1, the fifth node P_1, and the sixth node Q_1 are at high level. The voltage difference between the first and second electrodes of each of the fifth transistor T5, the seventh transistor T7, and the ninth transistor T9 is close to zero, thereby preventing the leakage of the electrical charges of the second node L_1 via the fifth transistor T5, the seventh transistor T7, and the ninth transistor T9. In the embodiments of the present disclosure, in any time period, when the voltage of the second node L of the shift register at any stage is at high level, the corresponding fifth transistor T5, seventh transistor T7, and ninth transistor T9 can prevent leakage.

In a second time period and a third time period, the first shift register SR_1 receives the high-level clock signal CLK1. Due to bootstrapping effect of the second capacitor C2, the voltage of the second node L_1 is further pulled up. Under the control of the higher-level voltage of the second node L_1, the fourth transistor T4 is turned on. The shift register SR_1 outputs the high-level scan driving signal OUT_1 via the output terminal OUTPUT_1. The high-level scan driving signal OUT_1 can be used to drive the first row of pixels in the display panel, and can also be used as the input signal STU_2 of the second shift register SR_2.

In a fourth time period, the output terminal OUTPUT_2 of the second shift register SR_2 outputs the high-level scan driving signal OUT_2. Therefore, the display reset signal STD_1 of the first shift register SR_1 is at high level. The seventh transistor T7 and the eleventh transistor T11 are turned on to provide the first voltage VGL (at low level) to the second node L_1 to reset the second node L_1. The fourth transistor T4 is turned off, and thus the low-level signal is output from the output terminal OUTPUT_1 of the first shift register SR_1. Furthermore, due to the inverter D, the low-level voltage of the second node L_1 results in the voltage of the third node M_1 to be high-level. The fifth transistor T5, the sixth transistor T6, and the tenth transistor T10 are turned on to provide the first voltage VGL (at low level) to the second node L_1 and the output terminal OUTPUT_1 to reset the second node L_1 and the output terminal OUTPUT_1.

After the first shift register SR_1 drives the first row of pixels to display, similarly, the second shift register SR_2, the third shift register SR_3, and other shift registers sequentially drive the second, third, and other rows of pixels in the display panel to perform the scan driving.

When displaying a frame of image, in order to compensate a row of pixels randomly, it is also necessary to store and maintain the voltage difference between the input signal and the blanking control signal. In an embodiment, when compensating the second row of pixels in the first frame, the following operations are also performed when the first frame of image is displayed. The operations of the second shift register SR_2 and related shift registers will be described below.

In the second time period, the first shift register SR_1 outputs the high-level scan driving signal OUT_1, and the input signal STU_2 of the second shift register SR_2 is at high level. The third transistor T3 and the ninth transistor T9 are turned on to provide the received input signal STU_2 to the second node L_2. The voltage of the second node L_2 is at high level and maintained by the second capacitor C2.

In the third time period, the first shift register SR_1 continuously outputs the high-level scan driving signal OUT_1. The input signal STU_2 of the second shift register SR_2 is continuously at high level. The third transistor T3 and the ninth transistor T9 are turned on. Therefore, the voltage of the second node L_2 is still at high level and maintained by the second capacitor C2.

Furthermore, the second shift register SR_2 receives the high-level compensation selection control signal OE and the high-level input signal STU_2, respectively. The first transistor T1 is turned on. Based on the received high-level compensation selection control signal OE, the received high-level input signal STU_2 is provided to the first node K_2. Therefore, the voltage of the first node K_2 is at high level. The second shift register SR_2 receives a high-level blanking control signal CLKS. The voltages of both electrodes of the first capacitor C1 are at high level. The first capacitor C1 is not charged, and maintains the voltage difference between the compensation selection control signal terminal and the first node K_2 at zero. The second shift register SR_2 receives the high-level blanking input signal BSTU_2. Based on the high-level voltage of the first node K_2, the received high-level blanking input signal BSTU_2 is provided to the second node L_2. Thereby, the high-level voltage is further provided to the second node L_2.

In an embodiment, the first capacitor C1 usually has a smaller capacitance than the second capacitor C2. Therefore, when the charging currents for the two capacitors are close to each other, the charging time required for the first capacitor C1 is shorter. Therefore, the compensation selection control signal OE and the blanking control signal CLKS have a shorter high-level voltage duration than other signals.

At this time, the other shift registers in the gate driving circuit 30 respectively receive the high-level compensation selection control signal OE and the low-level input signal STU. The first transistor T1 is turned on. Based on the received high-level compensation selection control signal OE, the received low-level input signal STU is provided to the first node K. Therefore, the voltage of the first node K is at low level. The other shift registers receive the high-level blanking control signal CLKS. Therefore, the voltages of the two electrodes of the first capacitor C1 are at high level and at a low level, respectively. The first capacitor C1 is charged and maintains the voltage difference between the high-level voltage and the low-level voltage.

In the fourth time period, the second shift register SR_2 receives the high-level clock signal CLK2. Due to the bootstrapping effect of the second capacitor C2, the voltage of the second node L_2 is further pulled up. Under the control of the higher-level voltage of the second node L_2, the fourth transistor T4 is turned on. Therefore, the second shift register SR_2 outputs the high-level scan driving signal OUT_2. The high-level scan driving signal OUT_2 can be used to drive the second row of pixels and can also be used as the input signal STU_3 of the third shift register SR_3.

In a fifth time period, the output terminal OUTPUT_3 of the third shift register SR_3 outputs the high-level scan driving signal OUT_3. Therefore, the display reset signal STD_2 of the second shift register SR_2 is at high level. The seventh transistor T7 and the eleventh transistor T11 are turned on. The first voltage VGL (at low level) is provided to the second node L_2 to reset the second node L_2.

The fourth transistor T4 is turned off, and thus the low-level signal is output from the output terminal OUTPUT_2 of the second shift register SR_2. Furthermore, due to the inverter D, the low level voltage of the second node L_2 results in the voltage of the third node M_2 to be high-level. The fifth transistor T5, the sixth transistor T6, and the tenth transistor T10 are turned on. The first voltage VGL is provided to the second node L_2 and the output terminal OUTPUT_2 to reset the second node L_2 and the output terminal OUTPUT_2.

Then, the blanking period of the frame begins. In a sixth time period, the blanking control signal CLKS is at high level. As the voltage difference between the first electrode and the second electrode of the first capacitor C_1 is maintained as zero, the voltage of the first node K_2 is at high level. The second transistor T2 is turned on to provide the high-level blanking input signal BSTU_2 to the second node L_2. Therefore, the voltage of the second node L_2 becomes high-level and is maintained by the second capacitor C2.

At this time, for other shift registers in the gate driving circuit, although the blanking control signal CLKS is at high-level, as the voltage difference between the first electrode and the second electrode of the first capacitor C1 is maintained as the voltage difference between the high-level voltage and the low-level voltage, the voltage of the first node K is at low level. The second transistor T2 is turned off Therefore, the second node L remains at low level.

In a seventh time period, the clock signal CLK2 becomes high-level, and thus the fourth transistor T4 is turned on. Due to the bootstrapping effect of the second capacitor C2, the voltage of the second node L_2 is further pulled up. At this time, the second shift register SR_2 may output the compensation driving signal OUT_2 according to the clock signal CLK2 to drive a sensing transistor for the second row of pixels to operate, and compensate the second row of pixels based on the sensed driving current.

At this time, for other shift registers, the second node L remains at low level, and the fourth transistor T4 is turned off. At this time, the output terminals of other shift registers output the low-level signals.

In an eighth time period, the compensation selection control signal OE and the blanking reset signal TRST are at high level. For each of the three shift registers, the first transistor T1 and the eighth transistor T8 are turned on. As a result, the input signal STU (at low level) is provided to the first node K to pull down the voltage of the first node K. The first voltage VGL (at low level) is provided to the second node L to pull down the voltage of the second node L. Furthermore, due to the inverter D, the low-level voltage of the second node L results in the voltage of the third node M to be high-level. The fifth transistor T5, the sixth transistor T6, and the tenth transistor T10 are turned on to provide the first voltage VGL to the second node L and the output terminal OUTPUT. As a result, the first node K, the second node L, and the output terminal OUTPUT are reset to achieve the global reset. Then, the driving timing sequence of the frame ends.

Although the principle of the random compensation is described as above in the case of outputting the compensation driving signal for driving the second row of pixels during the blanking period of the first frame, it is not limited thereto. In the embodiments of the present disclosure, when compensating the i-th row of pixels of the display panel during the blanking period of a certain frame, the timing sequence of the compensation selection control signal OE is the same as that of the blanking control signal CLKS during the display period of the frame. Further, the high-level voltage durations of the compensation selection control signal OE and the blanking control signal CLKS fall into the high-level voltage duration of the received input signal of the shift register at the i-th stage (corresponding to the i-th row of pixels). The voltage difference between the blanking control signal terminal and the first node of the shift register at the i-th stage is stored and maintained. Then, during the blanking period, the clock signal CLK is outputted, as the compensation driving signal, via the output terminal of the shift register at the i-th stage based on the high-level blanking control signal CLKS and the stored voltage difference. Thus, the sensing transistor for the i-th row of pixels is driven to operate, and the i-th row of pixels is compensated based on the sensed current. It should be noted that two signals having the same timing sequence means that two signals have the same timing for high level rather than having the same amplitude.

On the other hand, the embodiments of the present disclosure also provide an array substrate. The array substrate may include the gate driving circuits according to the embodiments of the present disclosure. Furthermore, the embodiments of the present disclosure also provide a display device including the above-mentioned array substrate. In an embodiment, the display device may be a liquid crystal panel, a liquid crystal TV, a display, an OLED panel, an OLED TV, an electronic paper display device, a mobile phone, a tablet computer, a laptop, a digital photo frame, a navigator, and any other product or component with a display function.

Figure 5:
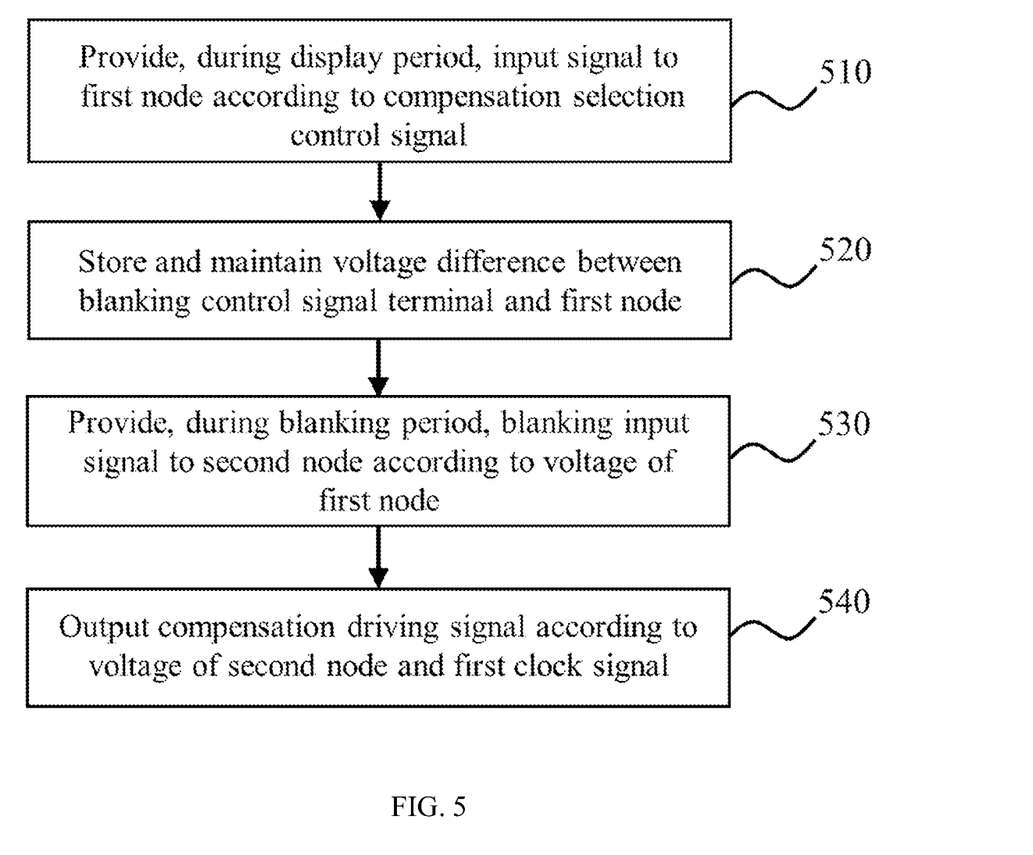
FIG. 5 shows a schematic flowchart of the method for driving a shift register according to some embodiments of the present disclosure.

Furthermore, the embodiments of the present disclosure also provide a method for driving the shift register. FIG. 5 shows a schematic flowchart of the method for driving the shift register according to an embodiment of the present disclosure. The shift register may be the shift register according to the embodiments of the present disclosure.

At step 510, the input signal is provided to the first node according to the compensation selection control signal during the display period. In an embodiment, when compensating a certain row of pixels, the high-level voltage duration of the compensation selection control signal OE falls into the high-level voltage duration of the input signal STU of the compensation selection circuit. The compensation selection circuit 100 provides the received high-level input signal STU to the storage circuit 200 according to the compensation selection control signal OE.

At step 520, the voltage difference between the blanking control signal terminal and the first node is stored and maintained. During the display period, the timing sequence of the blanking control signal CLKS is the same as the timing sequence of the compensation selection control signal OE, and the voltage difference between the blanking control signal terminal and the first node K is zero and maintained by the storage circuit 20. Furthermore, in an embodiment, the display input circuit 410 may provide the input signal to the second node L during the display period. According to the voltage of the second node L and the clock signal CLK, the scan driving signal is output from the output terminal OUTPUT as the input signal STU of the shift register at next stage to drive the corresponding pixels to display.

At step 530, during the blanking period, the blanking input signal is provided to the second node L according to the voltage of the first node K. As the voltage difference between the blanking control signal terminal and the first node K is zero, the timing sequence of the voltage of the first node K is consistent with the timing sequence of the blanking control signal CLKS. The blanking input circuit 300 provides the blanking input signal BSTU to the second node L according to the voltage of the first node K.

At step 540, the compensation driving signal is output according to the voltage of the second node L and the clock signal CLK. During the blanking period, for a certain row of pixels to be compensated, the shift register circuit 400 provides the clock signal CLK to the output terminal OUTPUT as the compensation driving signal according to the high-level voltage of the second node L. This compensation driving signal may be used to compensate the pixels in the certain row.

Those skilled in the art will appreciate that, although the steps are described in the shown order, it is not limited to such order, and the steps can be performed in any other suitable order.

Several embodiments of the present disclosure have been described specifically above, but the protection scope of the present disclosure is not limited thereto. Obviously, for those skilled in the art, various modifications, replacements, or variations can be made to the embodiments of the present disclosure without departing from the spirit and scope of the present disclosure. The protection scope of the present disclosure is defined by the appended claims.

What is claimed is:

1. A shift register comprising a compensation selection circuit, a storage circuit, a blanking input circuit, and a shift register circuit, wherein the compensation selection circuit is coupled to a compensation selection control signal terminal, an input terminal, and a first node, and is configured to provide an input signal from the input terminal to the first node according to a compensation selection control signal from the compensation selection control signal terminal;

wherein the storage circuit is coupled to a blanking control signal terminal and the first node, and is configured to store and maintain a voltage difference between the blanking control signal terminal and the first node;

wherein the blanking input circuit is coupled to the first node, a blanking input signal terminal, and a second node, and is configured to provide a blanking input signal from the blanking input signal terminal to the second node according to a voltage of the first node; and wherein the shift register circuit is coupled to the second node, a clock signal terminal, the input terminal, and an output terminal, and is configured to provide, during a blanking period, a compensation driving signal via the output terminal according to a voltage of the second node and a clock signal from the clock signal terminal, and provide, during a display period, a scan driving signal via the output terminal according to the input signal and the clock signal, wherein the shift register circuit comprises a display input circuit, an output circuit, a pull-down circuit, a pull-down control circuit, a display reset circuit, and a blanking reset circuit;

wherein the display input circuit is coupled to the input terminal and the second node, and is configured to provide the input signal to the second node;

wherein the output circuit is coupled to the second node, the clock signal terminal, and the output terminal, and is configured to output, during the display period, the scan driving signal according to the voltage of the second node and the clock signal, and output, during the blanking period, the compensation driving signal according to the voltage of the second node and the clock signal;

wherein the pull-down circuit is coupled to the second node, a third node, a first voltage terminal, and the output terminal, and is configured to control voltages of the second node and the output terminal according to a voltage of the third node;

wherein the pull-down control circuit is coupled to the second node and the third node, and is configured to control the voltage of the third node according to the voltage of the second node;

wherein the display reset circuit is coupled to a display reset signal terminal, the second node, and the first voltage terminal, and is configured to reset the voltage of the second node according to a display reset signal from the display reset signal terminal; and wherein the blanking reset circuit is coupled to the blanking reset signal terminal, the second node, and the first voltage terminal, and is configured to reset the voltage of the second node according to a blanking reset signal from the blanking reset signal terminal.

2. The shift register according to claim 1, wherein the compensation selection circuit comprises a first transistor, wherein a control electrode of the first transistor is coupled to the compensation selection control signal terminal, wherein a first electrode of the first transistor is coupled to the input terminal, and wherein a second electrode of the first transistor is coupled to the first node.

3. The shift register according to claim 1, wherein the storage circuit comprises a first capacitor, wherein a first electrode of the first capacitor is coupled to the blanking control signal terminal, and wherein a second electrode of the first capacitor is coupled to the first node.

4. The shift register according to claim 1, wherein the blanking input circuit comprises a second transistor, wherein a control electrode of the second transistor is coupled to the first node, wherein a first electrode of the second transistor is coupled to the blanking input signal terminal, and wherein a second electrode of the second transistor is coupled to the second node.

5. The shift register according to claim 1, wherein the blanking input signal terminal is coupled to the blanking control signal terminal.

6. The shift register according to claim 1, wherein the display input circuit comprises a third transistor, wherein a control electrode and a first electrode of the third transistor are coupled to the input terminal, and wherein a second electrode of the third transistor is coupled to the second node.

7. The shift register according to claim 1, wherein the output circuit comprises a fourth transistor and a second capacitor;
 wherein a control electrode of the fourth transistor is coupled to the second node, wherein a first electrode of the fourth transistor is coupled to the clock signal terminal, and wherein a second electrode of the fourth transistor is coupled to the output terminal; and
 wherein a first electrode of the second capacitor is coupled to the second node, and wherein a second electrode of the second capacitor is coupled to the output terminal.

8. The shift register according to claim 1, wherein the pull-down circuit comprises a fifth transistor and a sixth transistor;
 wherein a control electrode of the fifth transistor is coupled to the third node, wherein a first electrode of the fifth transistor is coupled to the second node, and wherein a second electrode of the fifth transistor is coupled to the first voltage terminal; and
 wherein a control electrode of the sixth transistor is coupled to the third node, wherein a first electrode of the sixth transistor is coupled to the output terminal, and wherein a second electrode of the sixth transistor is coupled to the first voltage terminal.

9. The shift register according to claim 1, wherein the pull-down control circuit comprises an inverter, wherein a first electrode of the inverter is coupled to the second node, and wherein a second electrode of the inverter is coupled to the third node.

10. The shift register according to claim 1, wherein the display reset circuit comprises a seventh transistor, wherein a control electrode of the seventh transistor is coupled to the display reset signal terminal, wherein a first electrode of the seventh transistor is coupled to the second node, and wherein a second electrode of the seventh transistor is coupled to the first voltage terminal.

11. The shift register according to claim 1, wherein the blanking reset circuit comprises an eighth transistor, wherein a control electrode of the eighth transistor is coupled to the blanking reset signal terminal, wherein a first electrode of the eighth transistor is coupled to the second node, and wherein a second electrode of the eighth transistor is coupled to the first voltage terminal.

12. A gate driving circuit comprising a plurality of cascaded shift registers according to claim 1.

13. The gate driving circuit according to claim 12, wherein an output terminal of the shift register at an N-th stage is coupled to an input terminal of the shift register at an (N+1)-th stage, where N is a positive integer.

14. The gate driving circuit according to claim 13, further comprising a compensation selection control signal line, a blanking control signal line, a blanking input signal line, a first clock signal line, and a second clock signal line,
 wherein the compensation selection control signal line is coupled to a compensation selection control signal terminal of each of the plurality of cascaded shift registers to provide a compensation selection control signal;
 wherein the blanking control signal line is coupled to a blanking control signal terminal of each of the plurality of cascaded shift registers to provide a blanking control signal;
 wherein the blanking input signal line is coupled to a blanking input signal terminal of each of the plurality of cascaded shift registers to provide a blanking input signal;
 wherein the first clock signal line is coupled to a clock signal terminal of the shift register at a (2N−1)-th stage to provide a clock signal; and
 wherein the second clock signal line is coupled to a clock signal terminal of the shift register at a 2N-th stage to provide the clock signal, where N is a positive integer.

15. The gate driving circuit according to claim 13, further comprising a compensation selection control signal line, a blanking control signal line, a first clock signal line, and a second clock signal line,
 wherein the compensation selection control signal line is coupled to a compensation selection control signal terminal of each of the plurality of cascaded shift registers to provide a compensation selection control signal;
 wherein the blanking control signal line is coupled to a blanking control signal terminal of each of the plurality of cascaded shift registers to provide a blanking control signal, and is coupled to a blanking input signal terminal of each of the plurality of cascaded shift registers to provide a blanking input signal;
 wherein the first clock signal line is coupled to a first clock signal terminal of the shift register at a (2N−1)-th stage to provide a clock signal; and
 wherein the second clock signal line is coupled to a clock signal terminal of the shift register at a 2N-th stage to provide the clock signal, where N is a positive integer.

16. An array substrate comprising the gate driving circuit according to claim 12.

17. A display panel comprising the array substrate according to claim 16.

18. A method for driving the shift register according to claim 1, the method comprising:
 providing, during a display period, an input signal to the first node according to the compensation selection control signal;
 storing and maintaining the voltage difference between the blanking control signal terminal and the first node;
 providing, during a blanking period, a blanking input signal to the second node according to a voltage of the first node; and
 outputting the compensation driving signal according to a voltage of the second node and a clock signal.

19. The method according to claim 18, further comprising:
 providing, during the display period, the input signal to the second node; and outputting a scan driving signal according to the voltage of the second node and the clock signal.

* * * * *

UNITED STATES PATENT AND TRADEMARK OFFICE
CERTIFICATE OF CORRECTION

| | |
|---|---|
| PATENT NO. | : 11,232,763 B2 |
| APPLICATION NO. | : 16/649519 |
| DATED | : January 25, 2022 |
| INVENTOR(S) | : Yuan et al. |

It is certified that error appears in the above-identified patent and that said Letters Patent is hereby corrected as shown below:

In the Specification

Column 15, Line 43, "first capacitor C_1 is" should read -- first capacitor C1 is --.
Column 15, Lines 56-57, "off Therefore" should read -- off. Therefore --.

Signed and Sealed this
Fourteenth Day of June, 2022

Katherine Kelly Vidal
*Director of the United States Patent and Trademark Office*